United States Patent [19]
Kawamoto

[11] 3,955,098
[45] May 4, 1976

[54] SWITCHING CIRCUIT HAVING FLOATING GATE MIS LOAD TRANSISTORS

[75] Inventor: Hiroshi Kawamoto, Kodaira, Japan
[73] Assignee: Hitachi, Ltd., Japan
[22] Filed: Aug. 8, 1974
[21] Appl. No.: 495,769

[30] Foreign Application Priority Data
Oct. 12, 1973 Japan.............................. 48-113929

[52] U.S. Cl................................ 307/205; 307/213; 307/214; 307/304
[51] Int. Cl.[2] ................. H03K 19/08; H03K 19/40; H03K 17/10
[58] Field of Search ........... 307/205, 213, 214, 251, 307/304, DIG. 4

[56] References Cited
UNITED STATES PATENTS

| | | |
|---|---|---|
| 3,619,670 | 11/1971 | Heimbigner .................... 307/251 X |
| 3,744,036 | 7/1973 | Bentchkowsky ............... 340/173 SP |
| 3,845,324 | 10/1974 | Feucht .............................. 307/205 |
| R27,305 | 3/1972 | Polkinghorn et al. .............. 307/251 |

OTHER PUBLICATIONS

MacDougall ete al., "Ion Implantation offers a bagful of benefits for MOS," *Semiconductor Memories*, edited by D. A. Hodges, *IEEE Press*, 1972, Reprinted from *Electronics*, (pub.), pp. 86-90, 6/22/1970.

Primary Examiner—John S. Heyman
Assistant Examiner—L. N. Anagnos
Attorney, Agent, or Firm—Craig & Antonelli

[57] ABSTRACT

A switching circuit comprises a driving MIS field-effect transistor, and a load MIS field-effect transistor, the gate of which is electrically floating and is so charged as to produce a gate voltage greater than the supply voltage of the load MIS field-effect transistor.

6 Claims, 5 Drawing Figures

SWITCHING CIRCUIT HAVING FLOATING GATE MIS LOAD TRANSISTORS

BACKGROUND OF THE INVENTION

1. Field of the Invention:

The present invention relates to a switching circuit and is mainly directed to an inverter circuit of an MIS integrated circuit, and has as an object providing a switching circuit which can improve the output voltage swing of an inverter without the need for two power sources.

2. Description of the Prior Art

In general, an inverter circuit of the MIS integrated circuit employs a MISFET as a load resistor and is classified into two types on the basis of the method of connection of a gate terminal, as illustrated in FIG. 1A and B. In this case, in the circuit in FIG. 1A, the load MISFET $T_L$ is used in a saturation mode in which the drain current does not depend on the drain voltage, while in the circuit in FIG. 1B, the load MISFET $T_L$ is used in a non-saturation mode in which the drain current depends on the drain voltage.

The swing of the output voltage of an inverter should desirably be large, and as between the two circuits, that in FIG. 1B is more advantageous in this respect. More specifically, in FIG. 1A, $V_{DD} = V_{GG}$, and the output level of the inverter circuit becomes $V_{OL} = V_{DD} - V_{THL}$ when driving MISFET $T_D$ is non-conductive, while in FIG. 1B, the output level of the inverter circuit becomes $V_{OL} = V_{DD}$ by making the gate voltage of the load MISFET $T_L$ greater than the drain voltage ($V_{GG} > V_{DD} + V_{THL}$).

The inverter circuit in FIG. 1B, however, has had the disadvantage that two power sources are required for the inverter circuit since the gate voltage $V_{GG}$ of the load MISFET $T_L$ must be greater than the drain voltage thereof.

Brief Summary of the Invention

To overcome these disadvantages the present invention includes both a driving MIS field-effect transistor and a load MIS field-effect transistor. The gate of the load transistor floats and is charged to produce a gate voltage larger than the supply voltage therefor.

DETAILED DESCRIPTION OF THE INVENTION

Figure 1A:
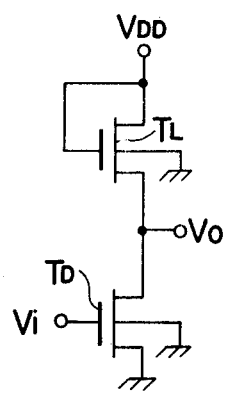
FIGS. 1A and B are circuit diagrams of prior-art inverter circuits, respectively.
Figure 1B:
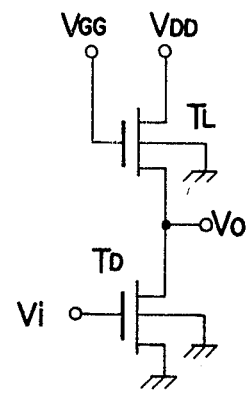
Figure 2A:
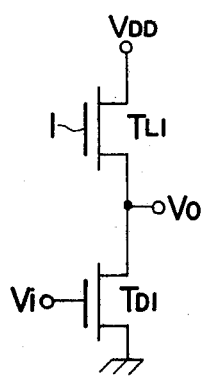
FIGS. 2A and B are a circuit diagram for explaining the fundamental construction of a switching circuit according to the present invention and a vertical side section of a semiconductor substrate formed with the fundamental circuit, respectively.
Figure 2B:
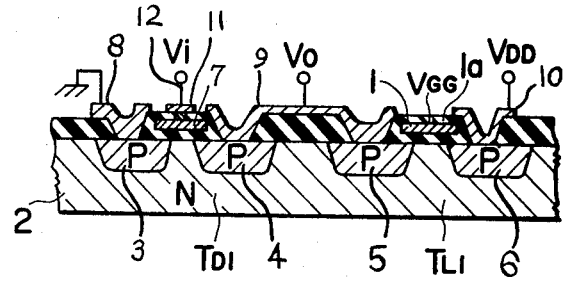

As is illustrated in both FIGS. 2A and 2B, the characterizing feature of the switching circuit of the present invention is that the gate 1 of a load MISFET $T_{L1}$ electrically floats, the gate 1 being charged with a predetermined quantity of charges which produce a gate voltage $V_{GG}$ (usually above 20-25 volts) greater than supply voltage $V_{DD}$ (usually above 15-20 volts) as represented by $V_{GG} > V_{DD} + V_{THL}$, where $V_{THL}$ is the gate threshold voltage. The gate 1 is covered with a gate insulating film ($SIO_2$ film) 1a at the surface of an N type silicon substrate 2 as is shown in FIG. 2B, so that the charge once charged in the gate (polycrystalline silicon) 1 can be retained substantially permanently (half-life is about 100 years). Also shown in FIG. 2B are the respective source and drain regions 3-4 and 5-6 of the driving and load transistors, to which respective electrodes 8, 9 and 10 are connected, as shown. The gate electrode layer 7 of driving transistor $T_{D1}$ is connected to input terminal 11, to which a voltage Vi is supplied, by way of conductor layer 12. Of course the conductivity type of the substrate and region may be reversed together with an appropriate change in voltage polarity.

Figure 3:
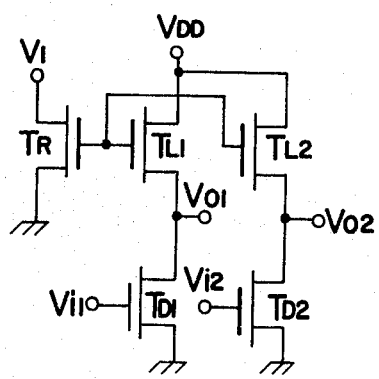
FIG. 3 is a circuit diagram of a concrete embodiment of the switching circuit of the present invention.

FIG. 3 shows a circuit diagram of a concrete embodiment of the switching circuit of the present invention. As illustrated in the figure, in the present embodiment, two fundamental inverter circuits as shown in FIG. 2 are connected in cascade, the drains of the respective load MISFETs $T_{L1}$ and $T_{L2}$ are connected in common and have the supply voltage $V_{DD}$ applied thereto, and the gates (floating gates) of the load MISFETs $T_{L1}$ and $T_{L2}$ are also connected in common and are connected to the gate of a writing-in MISFET $T_R$.

The gate of the writing-in MISFET $T_R$ has the floating structure similarly to the gates of the load MISFETs $T_{L1}$ and $T_{L2}$, and hence, the charges which produce the gate voltage $V_{GG}$ (above 20-25 volts) greater than the supply voltage $V_{DD}$ (10-15 volts) can be injected and charged into the gates in such way that a voltage $V_1$ (e. g. 30 volts) greater than the supply voltage $V_{DD}$ is applied to the drain of the FET $T_R$ to thereby bring the gate insulating film of the FET $T_R$ to avalanche breakdown. That is, the gate voltage of the floating gates of the load MISFETs $T_{L1}$ and $T_{L2}$ connected to the writing-in MISFET $T_R$ can be greater than the voltage $V_{DD}$ by charging the gate of the MISFET $T_R$. For a voltage $V_1$ of 30 volts, the floating gates of the load MISFETs $T_{L1}$ and $T_{L2}$ reach a voltage of about 28 volts.

As the method for charging predetermined charges into the floating gate of the load MISFET, there can also be applied, for example, a method in which the gate is selectively subjected to ion irradiation. According to this technique, in order to obtain a gate voltage of 20 volts, ions are irradiated onto the surface of the floating gate to a concentration of $2 \times 10^{16}$ /cm$^3$. The gate voltage is proportional to the concentration of ions irradiated. A mask for selective ion irradiation is necessary in this case, and in this regard, since the embodiment in FIG. 3 employs the same MIS structure in the load MISFETs and the driving MISFETs, it is easy in manufacture and rich in mass-producibility.

The present invention can be extensively applied to a NAND gate, a NOR gate, etc. in addition to the inverter circuit.

As explained above, according to the switching circuit of the present invention, in a switching circuit having at least a driving MIS transistor and a load MIS transistor, the gate of the load MIS transistor floats and is charged with a predetermined quantity of charges which produces a voltage greater than the drain supply voltage of the load MIS transistor, so that a power source for supplying a gate voltage for the load MIS transistor becomes unnecessary and the output voltage swing of the switching circuit can accordingly be made large in spite of the single power source. Moreover, since the switching circuit of the present invention requires, as compared with the prior-art switching circuit, merely placing the gate of the load MIS transistor into the floating structure, it can be formed in a simple construction as a semiconductor integrated circuit device.

While I have shown and described one embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. In a switching circuit including a first driving metal-insulator-semiconductor transistor and a first load metal-insulator-semiconductor transistor connected in series with a source of supply voltage, and a second driving metal-insulator-semiconductor transistor and a second load metal-insulator-semiconductor transistor connected in series with said source of supply voltage, the improvement wherein the gate electrodes of said first and second load transistors are connected in common, electrically float and have a prescribed quantity of charge stored thereon, so that the gate voltages of said load transistors exceed said power supply voltage.

2. In a switching circuit including a driving metal-insulator-semiconductor transistor and a load metal-insulator-semiconductor transistor connected in series with a source of supply voltage, the improvement wherein the gate electrode of said load transistor electrically floats and has a prescribed quantity of charge stored thereon so that the gate voltage of said load transistor exceeds said power supply voltage, and further comprising means for applying said prescribed quantity of charge to the gate electrode of said load transistor, said means comprising a writing-in metal-insulator-semiconductor transistor having its gate electrode connected to the gate of said load transistor and its source and drain electrodes connected to respective voltage sources, the difference between which is greater than said source of supply voltage, for effecting avalanche breakdown in the insulating layer of said writing-in transistor, to charge the gate thereof to a potential greater than said source of supplying voltage, and thereby charge the gate electrode of said load transistor.

3. A circuit comprising:
a first plurality of insulated gate field effect transistors;
a second plurality of insulated gate field effect transistors;
first and second terminals to which first and second sources of reference potential are supplied;
each transistor of said first plurality of transistors being connected in series with a respective transistor of said second plurality of transistors, between said first and second terminals;
input terminals connected to the gate electrodes of said first plurality of transistors;
output terminals connected to the common connections of said first and second pluralities of transistors, respectively; and wherein
the gate electrodes of said second plurality of transistors are connected in common, are electrically floating and have a prescribed amount of charge stored therein, so that the effective gate voltage of said second plurality of transistors exceeds the difference between said first and second sources of reference potential.

4. A circuit according to claim 3, wherein said first source of reference potential is ground potential.

5. A circuit comprising:
a first insulated gate field effect transistor;
a second insulated gate field effect transistor;
first and second terminals to which first and second sources of reference potential are supplied;
said first and second transistors being connected in series between said first and second terminals;
an input terminal connected to the gate electrode of said first transistor;
an output terminal connected to the common connection of said first and second transistors; and wherein
the gate electrode of said second transistor is electrically floating and has a prescribed amount of charge stored therein, so that the effective gate voltage of said second transistor exceeds the difference between said first and second sources of reference potential;
and further including
a third insulated gate field effect transistor having its gate electrode effectively electrically floating and connected to the gate electrode of said second transistor, and having its source and drain electrodes connected to respective sources of supply voltage, the difference between which exceeds the difference between said first and second sources of reference potential, thereby effecting avalanche breakdown in the insulating layer of said third transistor, to charge the gate electrode thereof to a potential greater than the difference between said second and first sources of supply voltage and thereby charge the gate electrode of said second transistor.

6. A circuit according to claim 5, wherein said first source of reference potential is ground potential.

* * * * *